United States Patent [19]
Hsieh et al.

[11] Patent Number: 5,885,425
[45] Date of Patent: Mar. 23, 1999

[54] METHOD FOR SELECTIVE MATERIAL DEPOSITION ON ONE SIDE OF RAISED OR RECESSED FEATURES

[75] Inventors: Julian Juu-Chuan Hsieh, Bronx, N.Y.; Donald McAlpine Kenney, Shelburne, Vt.; Thomas John Licata, LaGrangeville, N.Y.; James Gardner Ryan, Newton, Conn.

[73] Assignee: International Business Machines Corporation, Armonk, N.Y.

[21] Appl. No.: 470,604

[22] Filed: Jun. 6, 1995

[51] Int. Cl.⁶ .................................................. C23C 14/34
[52] U.S. Cl. .............................. 204/192.12; 204/192.15; 204/192.3; 204/298.11
[58] Field of Search ........................... 204/192.1, 192.12, 204/192.15, 192.25, 192.3, 298.11; 438/694, 696; 216/17, 18, 19, 38, 39, 46; 156/636.1, 643.1; 437/228

[56] References Cited

U.S. PATENT DOCUMENTS

| | | | |
|---|---|---|---|
| 4,303,489 | 12/1981 | Morrison, Jr. | 204/192.12 |
| 4,508,612 | 4/1985 | Blackwell et al. | 204/298.11 |
| 4,532,698 | 8/1985 | Fang et al. | 438/286 |
| 4,724,060 | 2/1988 | Sakata et al. | 204/298.12 |
| 4,756,810 | 7/1988 | Lamont, Jr. et al. | 204/192.3 |
| 4,801,988 | 1/1989 | Kenney | 257/304 |
| 4,824,544 | 4/1989 | Mikalesen et al. | 204/298.06 |
| 5,171,412 | 12/1992 | Talieh et al. | 204/192.15 |
| 5,185,290 | 2/1993 | Aoyagi et al. | 437/228 |
| 5,223,108 | 6/1993 | Hurwitt | 204/192.15 |
| 5,441,094 | 8/1995 | Pasch | 438/690 |
| 5,518,594 | 5/1996 | Marcquart et al. | 204/298.11 |
| 5,597,462 | 1/1997 | Cho | 204/298.11 |

FOREIGN PATENT DOCUMENTS

| | | | |
|---|---|---|---|
| 0 044 372 A3 | 1/1985 | European Pat. Off. . | |
| 62-199033 | 9/1987 | Japan . | |
| 63-63260 | 10/1988 | Japan | 204/298.11 |
| 5-182962 | 7/1993 | Japan | 204/298.11 |
| 6-136527 | 5/1994 | Japan | 204/298.11 |

OTHER PUBLICATIONS

Toshiro Ono, Masatoshi Oda, Chiharu Takahashi, Seitaro Matsuo; Reactive Ion Stream Etching Utilizing Electron Cyclotron Resonance Plasma; American Vacuum Society, 1986, pp. 696–700.

D. M. Kenney; V–Groove Charge–Coupled Device; IBM Technical Disclosure Bulletin vol. 21, No. 8, Jan. 1979; p. 3110.

(List continued on next page.)

*Primary Examiner*—Nam Nguyen
*Assistant Examiner*—Rodney G. McDonald
*Attorney, Agent, or Firm*—Whitham, Curtis & Whitham; Eric W. Petraske, Esq.

[57] ABSTRACT

An apparatus and method provide deposition on a surface by angled sputtering using a collimation grid having angled vanes which limit the distribution of trajectories of particles in at least one coordinate direction around a central axis oriented at an angle of less than 90° to said surface; resulting in improved uniformity of deposition and/or selective favoring of deposition on surfaces at a high angle to the deposition surface (e.g. sidewalls). Substantially parallel orientation and uniform spacing of the sputtering target and deposition surface provides good uniformity of results over the deposition surface. The angled trajectories of sputtered particles provides improved deposition on sides of upstanding mandrel features and filling of recessed features of high aspect ratio, especially when the collimation grid is rotated about an axis generally perpendicular to the deposition surface. Angled, collimated deposition also allows for control of deposition at potentially sub-lithographic feature sizes by using portions of features as a mask with deposition being performed only on remaining exposed portions of features or deposition on selected sides of a mandrel feature. Sidewall image transfer techniques may thus be extended to non-symmetrical and singular features. At very shallow angles to the deposition surface, deposited material has a fibrous texture with greatly increased effective surface area.

16 Claims, 7 Drawing Sheets

OTHER PUBLICATIONS

N. G. Nakhodkin & A. I. Shaldervan; Effect of Vapour Incidence Angles on Profile and Properties of Condensed Films; Thin Solid Films; Revised Oct. 10, 1971; pp. 109–121.

A. G. Derls & M. J. Leamy; Columnar Microstructured in Vapor–Deposited Tin Films; Thin Solid Films; 1977, pp. 219–233.

J. G. Ryan, R. Douse, L. Hahn, & M. Luciano; The Effect of Substrate Temperature on Topography Related Defect Formation in Evaporated Aluminum Based Thin Films; J. Vac. Scl. Tech. A 3(6); 1985; pp. 2293–2297.

J. L. Vossen & J. J. Cuomo; Glow Discharge Sputter Deposition; Thin Film Processes; 1978; pp. 32–39.

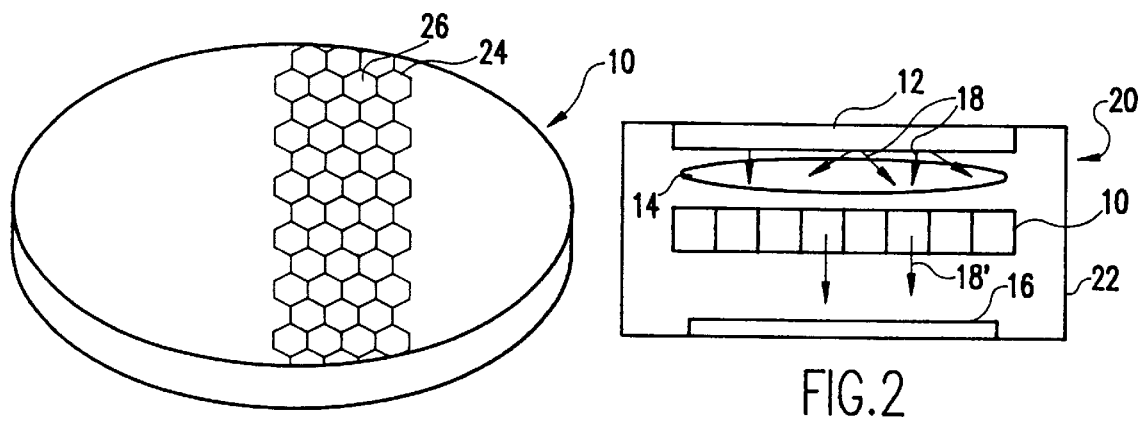
FIG. 1 PRIOR ART
FIG. 2 PRIOR ART
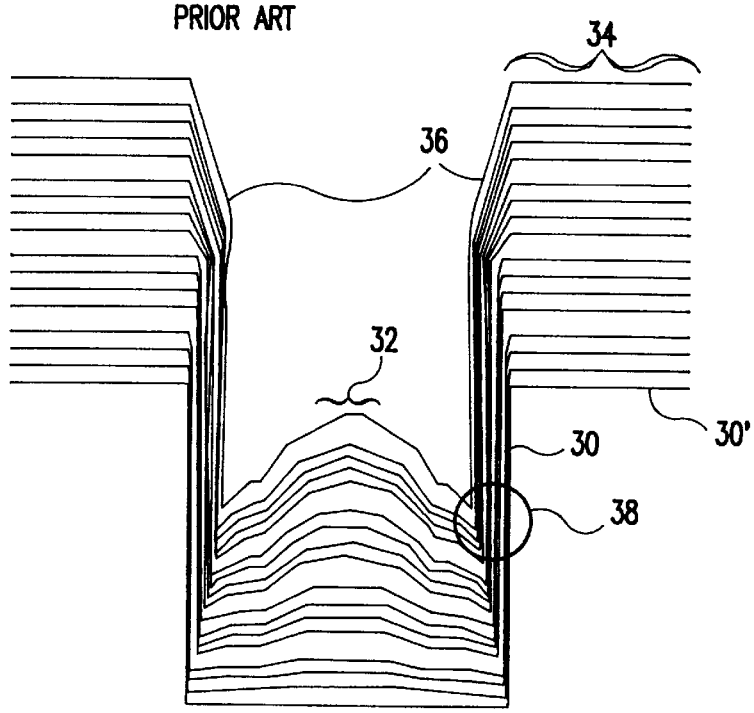
FIG. 3 PRIOR ART
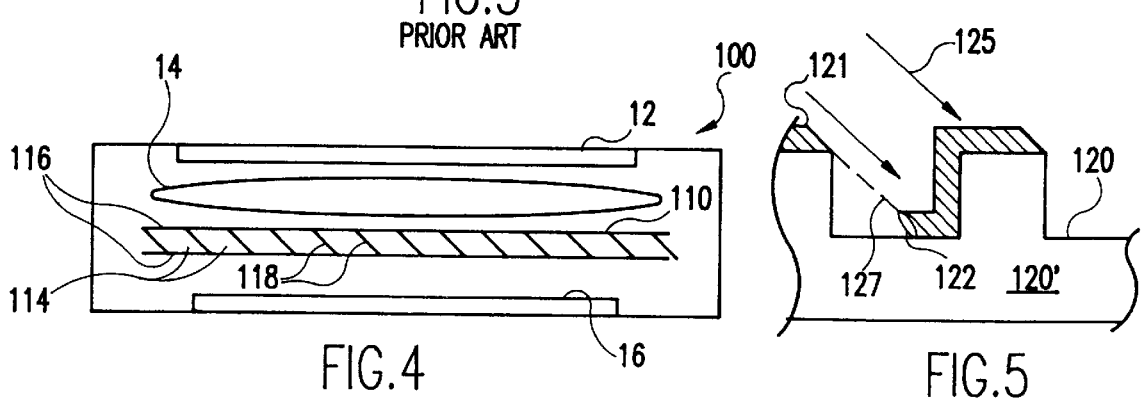
FIG. 4
FIG. 5

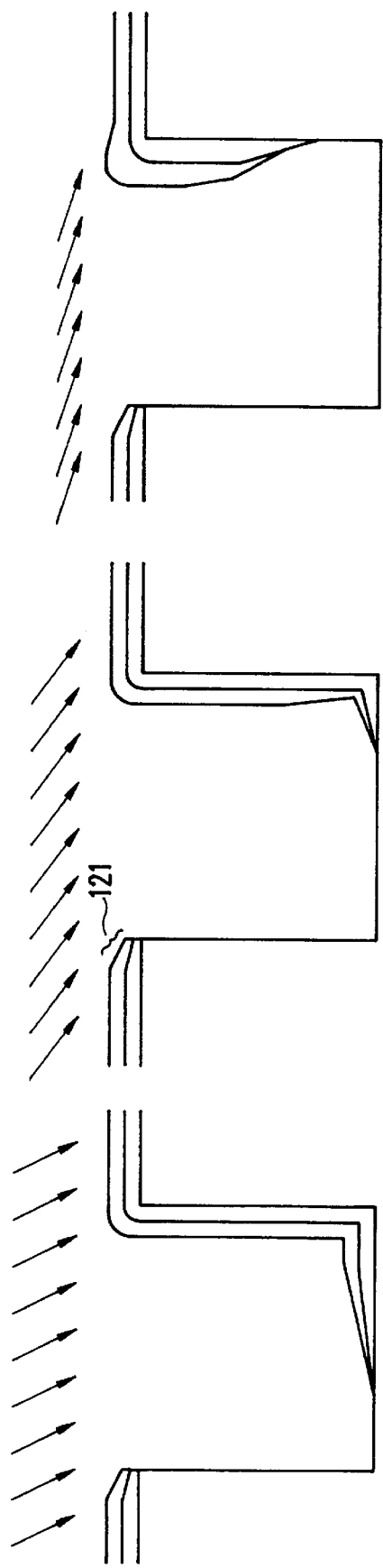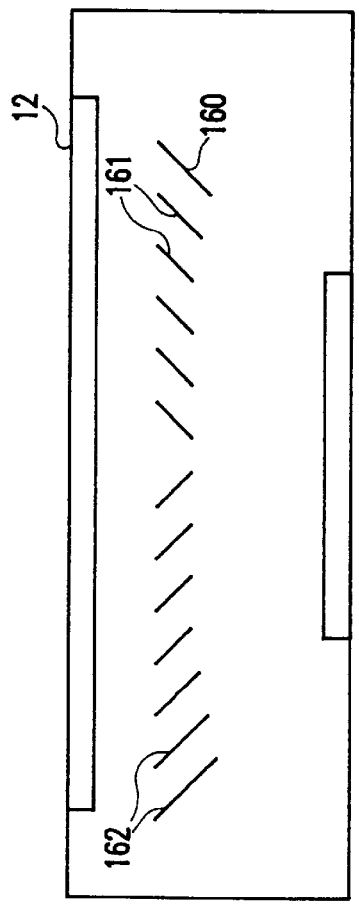

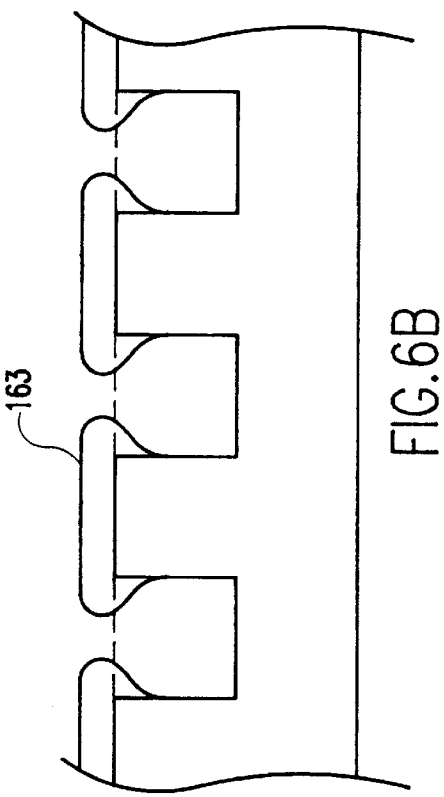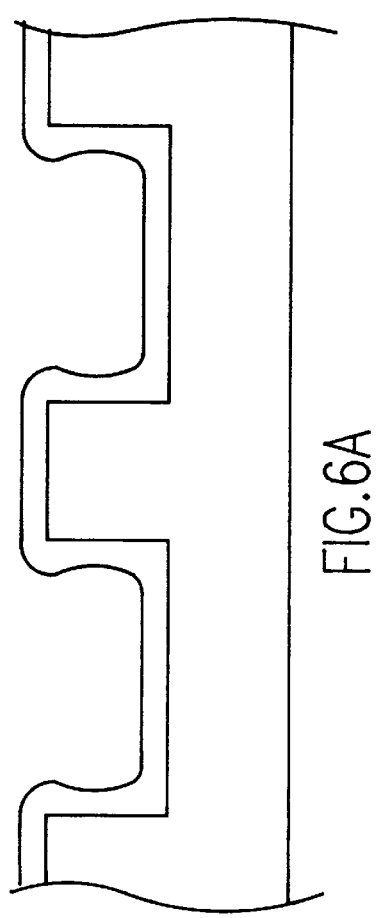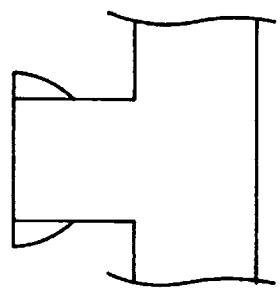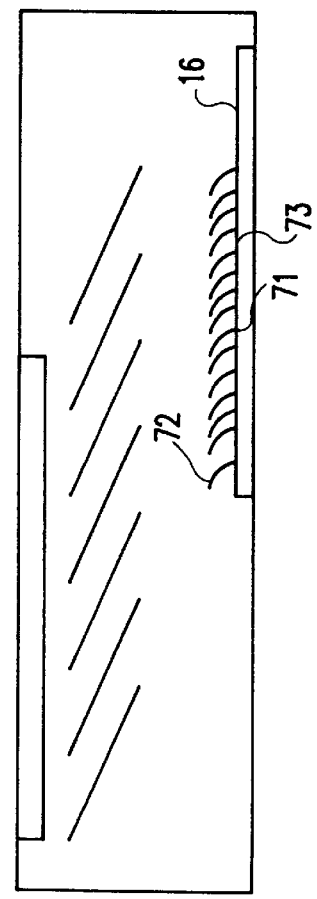
FIG.6A
FIG.6B
FIG.6C
FIG.7

METHOD FOR SELECTIVE MATERIAL DEPOSITION ON ONE SIDE OF RAISED OR RECESSED FEATURES

BACKGROUND OF THE INVENTION

1. Field of the Invention

The present invention generally relates to the deposition of materials on a surface having severe topography, including the formation of patterns of potentially sub-lithographic dimensions and, more particularly, to particular arrangements for material deposition by sputtering especially for treatment of surfaces and fabrication of micromachines and semiconductor devices at high integration density.

2. Description of the Prior Art

In the field of integrated circuit and micromachine fabrication, many steps in highly complicated processes involve the removal or deposition of material and many techniques are known and widely practiced for the achievement of either result. In general, techniques for obtaining either result are classified as isotropic or anisotropic to indicate whether or not they can be expected to proceed in a preferred direction. Anisotropy can also be induced by convoluted surface topography with isotropic processing. Thus, in practice, most of these techniques, particularly for material deposition, are neither ideally isotropic nor ideally anisotropic. Deposition rates can also be significantly affected by the topography of the surface(s) on which deposition is to be performed, particularly in sputtering techniques where material is eroded from one surface (referred to as a target) and redeposited on another surface.

As is well-understood in the art, the rates of material deposition in sputtering processes are highly dependent on the angle of incidence of atoms or ions at the surface where deposition is to occur. That is, the likelihood of deposition of a particular atom or ion at a particular location on a surface increases as the angle of incidence approaches perpendicular to the surface at that location. Therefore, when the trajectories of sputtered particles are widely distributed, deposition will appear to be severely affected by surface formations and topographies which reduce the number of particles which reach particular regions of the surface. On the other hand, when the trajectories are confined, such as with collimation, deposition on surfaces substantially perpendicular to the particle trajectories as established by the collimation will be strongly preferred.

Severe surface topographies thus present substantial difficulties in obtaining desired deposits of material, whether the goal of the particular deposition process is uniformity of deposit thickness or high selectivity between surfaces on which deposits are to be formed. This problem is aggravated since, particularly at very small feature sizes comparable to minimum feature sizes available with current lithographic processes, the surface topography is dynamically changed by the thickness of the deposit as the deposition process is carried out.

More specifically, as integration densities have increased and feature sizes have decreased in integrated circuits, for example, it has become necessary to perform filling of relatively high aspect ratio (e.g. greater than 1:1 ratio of feature depth to transverse dimension of the feature) trenches or apertures in a substrate or layer. Isolation trenches and trench capacitors are examples of structures requiring such trench filling (generally with $SiO_2$ and polysilicon, respectively) typically by chemical vapor deposition and other known techniques, including sputtering. However, chemical vapor deposition is currently considered to be much preferred over sputtering to fill severe topography for the reasons noted above. Similar high aspect ratio features and requirements for filling and/or deposition on severe topographies are also commonly encountered in micromachines.

Sputtering techniques are currently used principally for the deposition of metal for the formation of conductor patterns and collimation is known to improve deposition on severe topographies. However, collimation itself reduces the deposition rate of sputtered material, particularly on the recess (e.g. trench) sidewalls and develops an overburden or overhang at the top edges of the trench which causes non-uniformity across the bottom of the trench or aperture. In comparison, with uncollimated sputtering, the surface topography alters trajectory distribution of sputtered particles at different locations on a surface (hereinafter referred to as a "deposition surface" which may or may not feature severe topography as distinguished from the individual surfaces of particular features which may constitute severe topography of the deposition surface) which, in turn, causes deposition on trench or aperture sidewalls to proceed at a faster rate near the top of the trench, forming an overburden at the top of the trench, which similarly causes thinner and non-uniform deposition at the trench bottom and reduces the rate at which deposition occurs.

Further, with either collimated or uncollimated sputtering, because of deposition on sidewalls near the top of the trench or aperture, deposition in the corners of the bottom of the trench or aperture and in similarly shaped portions of severe surface topography is particularly compromised. When filling of trenches or apertures is attempted, these variations from uniformity of deposition may cause defects such as so-called keyhole voids within the incompletely filled trench or aperture. Layered structures, particularly for conductors crossing severe topography will also be formed with reduced thickness at a point where the surface orientation abruptly changes (e.g. from horizontal to vertical).

Perhaps more importantly, as integration density has increased, the "value" of surface area on the chip or features which may be formed thereon has increased and a technique to increase the usable area of a chip of given dimensions is critical to increased "device counts" for particular integrated circuit designs. In an attempt to accomplish such an effective increase in area where devices can be formed, several types of structures have been proposed but which require the ability to form substantially uniform deposits on surfaces which are at a large angle to the major dimension (e.g. deposition surface) of a wafer, such as the sidewalls of a trench or aperture. While collimated sputtering in a direction perpendicular to the wafer surface is known to favor deposition at the bottoms of such formations, sidewall deposition continues to be non-uniform.

Additionally, for maximum integration density of integrated circuits or the highest degree of miniaturization of micromachines, it is conventional to form at least some of the trenches and apertures or other features at or near the minimum feature size obtainable with the lithographic technology chosen for the design. Therefore, in such a case, any structure formed within the trench would be, necessarily, of sub-lithographic dimensions, at least for the same lithographic technology. Further, process complexity and cost increases dramatically for lithographic processes as minimum feature size is decreased. Criticality of registration is also increased and process tolerances reduced along with potential adverse impact on manufacturing yields.

Some techniques are known for production of so-called sub-lithographic feature sizes. A widely known technique, commonly referred to as sidewall image transfer (SIT), uses a combination of isotropic and anisotropic processes to form narrow sidewalls on a projecting feature, known as a mandrel, which may be later removed. (Similar topography is presented by a recessed feature, such as a trench, although trenches must remain in the structure of the design. Formations of the sidewalls of a trench are generally referred to as "spacers".) However, the sidewall structures can only be formed symmetrically in closed patterns on all sides of the feature (e.g. seen as pairs in the cross-section of a mandrel or trench). While closed patterns have found substantial utility in self-aligned semiconductor processes and can be modified with other lithographic processes such as masked etching, no process has existed for providing a single sub-lithographic pattern by sidewall image transfer. For example, the utility of angled sidewall deposition at an angle of 5° to 25° to the substrate surface in combination with angled impurity implantation is suggested for forming a field-effect transistor having an extremely short channel and gate alignment of improved accuracy in U.S. Pat. No. 4,532,698 to Frank F. Fang et al. which is assigned to the assignee of the present invention. However, the technique disclosed therein relies on the shallowness of the angle of deposition to minimize the thickness of deposition on horizontal surfaces so that any substrate deposition can be etched away without significant change of thickness of sidewall deposition and thus effectively assumes only a single vertical surface is available (at least within a distance which would severely limit integration density) for formation of a sidewall deposit.

In any case, known processes for carrying out SIT techniques are complicated and require close process tolerances. Further, SIT techniques may be compromised by non-uniform deposition on sidewall surfaces and/or variation from ideal anisotropy of etching applied to remove material other than that deposited on vertical surfaces, particularly when the sidewall deposit is reduced in thickness significantly below dimensions available with lithographic techniques.

Other applications such as micromachines also require structures which are of a geometry which may or may not have utility in integrated circuits. For example, a sub-lithographic T-shaped structure may provide benefits in electronic devices operating on vacuum tube rather than semiconductor principles for application in environments where strong electromagnetic fields may be encountered. Such a shape cannot be formed by sidewall image transfer since that process provides no selectivity between portions of the sidewall. Likewise, micromachine impellers may derive increased efficiency from particular shapes which cannot be formed by SIT techniques.

Numerous applications are also known where efficiency and/or degree of size reduction can be increased by surface treatments. For example, it is known that techniques which roughen the surface of material, such as the production of so-called hemispherical grains can increase the effective surface area and the capacitance value of capacitors of a fixed overall size. Other applications in which performance depends on increased surface area include but are not limited to solar-cells, material detectors, catalysts, fluid filters, and the production of porous surfaces, such as in some types of filters. Surface topography as well as area may also be of importance, for example, in optical or ultrasonic applications. Known surface treatment techniques are, however, somewhat limited in the amount of effective increase of surface area which can be achieved. For example, while still a highly significant improvement in capacitors, hemispherical grain provides an effective surface area increase which is limited to about 40%.

Some research has also been done in performing material deposition techniques at an angle. However, angled evaporation or sputtering has generally resulted in poor uniformity over large wafer areas required for economical throughput of semiconductor processing reactors. This problem has been attributed, in regard to uncollimated sputtering, to non-uniformities in the trajectories of particles ejected from the sputtering target which generally form lobes which are directed in dependence on grain orientation in the target. Even with collimated sputtering or attempts to exploit preferred angles of particle ejection from a sputtering target, directivity of the particles toward the deposition surface on which material is to be deposited may be lost over distances as short as about two centimeters, limiting the area which can receive relatively uniform deposition as distance from the sputtering target varies.

It should also be noted that collimated sputtering for filling of trenches, apertures and other severe surface topography and angular deposition techniques as practiced to date have been mutually exclusive processes. Collimation requires use of a collimation grid generally having apertures with an aspect ratio of 1:1 or greater (although lower aspect ratios may be used for some applications when necessitated by a trade-off between deposition rate and degree of particle directivity) and limits the angular distribution of trajectories of particle to be deposited. Such limitation of the angle of particle trajectories would require a substantial distance from the target to the wafer if a collimation grid were to be applied to the target during angled sputtering in order to obtain coverage for the transverse dimension of the wafer surface. If the deposition surface is inclined to the sputtering target and the direction of collimation of the collimation grid as has generally been done, substantial differences in distance from the sputtering target to the deposition surface will be presented at different locations on the deposition surface.

For this reason, collimated sputtering is principally performed only in a direction perpendicular to the deposition surface on which material is to be deposited, often with a grid formed with hexagonal cells in a "honeycomb" pattern for collimation over the wafer surface since such a collimator may be placed close to the surface. Accordingly, no technique is currently available which can favor deposition on sidewalls of upright formations, uniformly provide angled material deposition, form substantially uniform depositions on vertical sidewalls over the surface of a wafer or provide selectivity between portions of sidewalls.

SUMMARY OF THE INVENTION

It is therefore an object of the present invention to provide an apparatus and method for performing angled, collimated sputtering, particularly over a relatively large area with substantially uniform deposition rates.

It is another object of the invention to provide a sputtering apparatus and methodology which selectively favors material deposition on the sidewalls of upstanding features.

It is a further object of the invention to provide an apparatus and methodology capable of producing singular sub-lithographic features as masks in a sidewall image transfer technique.

It is yet another object of the present invention to provide an apparatus and methodology capable of being used to create geometries not heretofore possible at extremely small sizes.

It is a yet further object of the invention to provide an apparatus and methodology capable of achieving asymmetrical and highly selective material deposition and/or material deposition of greatly increased uniformity over severe topography.

It is another further object of the invention to provide a surface treatment apparatus and methodology capable to increasing effective surface area of a material to a greater degree than previously possible.

In order to accomplish these and other objects of the invention, a method of depositing material on a surface is provided including the steps of orienting the surface and a surface of a sputtering target generally parallel to each other, removing particles of material from the sputtering target in the presence of a plasma, limiting a distribution of trajectories of a portion of the particles in at least one coordinate direction around a central axis oriented at an angle of less than 90° to said surface, and depositing at least some of said particles on said surface.

In accordance with another aspect of the invention, a collimation grid is provided including a plurality of slats oriented parallel to each other and at an angle to a surface of said collimation grid.

In accordance with a further aspect of the invention, an apparatus is provided for depositing material on a surface by sputtering including a collimation grid having a plurality of slats oriented parallel to each other and at an angle to a surface of said collimation grid.

In accordance with a further aspect of the invention, a device is provided which includes a strap connection formed by a process including the steps of forming a recess above a structure to which the strap connection is to be made, applying a mask to a first portion of a surface within of the recessed feature using an edge of the recessed feature to mask a second portion of the surface within the recessed feature, and depositing material on the second portion of said recessed feature.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a perspective view of a known collimator for trench filling,

FIG. 2 is a schematic cross-sectional view of a known reactor for feature filling by collimated sputtering, FIG. 3 is a cross-sectional profile of material deposited in a recess by the apparatus of FIGS. 1 and 2, FIG. 4 is a schematic cross-sectional view of a reactor for performing angled sputtering in accordance with the invention, FIG. 5 is an idealized cross-sectional view of deposits formed on a surface having severe topography using a reactor similar to FIG. 4, FIGS. 5A, 5B and 5C are cross-sectional views of simulated depositions formed with different angles of incident particle trajectory as would be performed with the apparatus of FIG. 3, FIG. 6 is an embodiment of the invention using a variant form of angled collimator, FIGS. 6A and 6B are cross-sectional views of a deposition profile obtained with the variant form of angled collimator shown in FIG. 5, FIG. 6C is a cross-sectional view of a structure which can be achieved by further processing of the distribution profiles shown in FIG. 6B, FIG. 7 is a particular adaptation of the invention for surface treatment.

DETAILED DESCRIPTION OF A PREFERRED EMBODIMENT OF THE INVENTION

Figure 8:
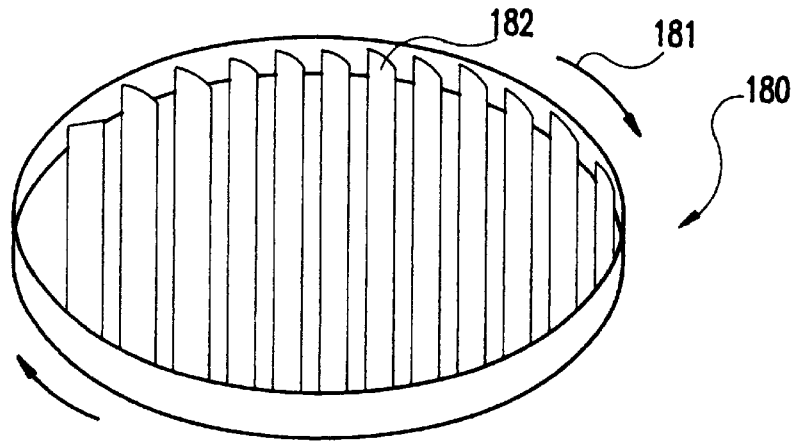
FIG. 8 is a perspective view of a collimator in accordance with the invention particularly adapted for increasing uniformity of deposit thickness on surfaces having severe topography.

Referring now to the drawings, and more particularly to FIG. 1, there is shown a conventional collimation grid (or, simply, "collimator") 10 for collimated sputtering such as is currently used for trench filling. A schematic cross-sectional view of a reactor 20 for sputtering and including the collimation grid of FIG. 1 is illustrated in FIG. 2. Collimator 10 essentially comprises a network of relatively thin webs 24 defining an array of apertures 26; each such aperture 26 having an aspect ratio of about 1:1 or greater and which may be advantageously adjusted in accordance with the aspect ratio of the recess (e.g. trench or aperture) to be filled, as described in U.S. patent application Ser. No. 07/690,171, abandoned in favor of continuing application Ser. No. 08/036,224, now U.S. Pat. No. 5,401,675. This is preferably achieved by locating the webs 24 such that hexagonal apertures are formed in a honeycomb pattern. This arrangement allows the apertures to be closely nested to cover as much of the collimator surface as possible while providing reduced difference between maximum and minimum transverse dimensions of the apertures (e.g. as opposed to square or triangular apertures), consistent with close nesting; which difference represents an effective variation in aspect ratio. The honeycomb array also results in good structural robustness for the collimation grid 10.

When collimation grid 10 is used in a reactor 20 for performing sputtering, as schematically illustrated in FIG. 2, particles of material eroded from target 12 due to impingement of particles from plasma 14 will have a wide distribution of trajectories as indicated by arrows 18. For purposes of understanding the invention, this distribution of trajectories may be regarded as random and generally uniform although, as indicated above, the ejection angles of particles from the target will generally be distributed in lobes depending on the crystallographic orientation of grains of material at the surface of the target.

Particles eroded from the target which reach the collimator at angles greater than can be passed through apertures 24 in collimator 10 will be intercepted (e.g. by deposition on the collimator) and will not reach the surface 16 where deposition is intended. Remaining particles which are able to pass through collimator 10 thus have a limited trajectory distribution centered around a direction perpendicular to the collimator, as indicated by arrows 18'. Since deposition rate varies with angle of impingement on a surface and is maximized for perpendicular impingement, such a trajectory distribution strongly favors deposition on surfaces which are parallel to the collimator, as shown in FIG. 3.

As may be readily observed from the simulated deposition depicted in FIG. 3, the deposition rate at the center 32 of a recessed feature 30 is very similar to the deposition rate on the surface 34 surrounding the recessed feature and very much greater than the deposition rate on the sidewalls of the recessed feature. However, the non-uniformity of the deposit across the bottom of the recessed feature is quite evident. This non-uniformity is primarily due to the trajectory distribution of the incident particles from the collimator 10 which will also be affected by the shadowing effect of the recessed feature, itself, for trajectories which are not normal to surface 30'.

This latter effect causes the development of an overburden 36 near the top of the recessed feature which also tends to aggravate non-uniformity of deposition at the bottom of the recessed feature. While appearing small in this simulation, overburden 36 may be relatively much larger when the recessed feature is very small and, in severe cases, may close the recessed feature before filling of the recessed feature is complete. It should be noted in this regard that the formation of the overburden accelerates as deposition proceeds since the dynamically changing shape of the overburden provides additional and increasing surface for the impingement of sputtered particles.

As can also be readily observed, these combined and progressive effects most severely reduce deposition rate in the lower corners of the recessed feature such as in the region indicated by circle 38 as the recessed feature is filled. In the case where a layer of material is to be deposited in the recessed feature instead of filling the feature, the reduced thickness developed in the lower corners and the sidewalls of the recessed feature severely compromise the electrical properties of the layer, whether conductive or insulative.

Referring now to FIG. 4, a reactor 100 including an angled collimation grid or collimator 110 in accordance with the invention is schematically illustrated in a manner similar to the illustration of FIG. 2. A perspective view of a suitable form of collimator 110 is shown in FIG. 8. Sputtering target 12, plasma 14 and deposition surface 16 are provided substantially as described above and the same reference numerals are used. The collimation grid 110, however, is formed with vanes or slats 118 positioned at an angle to the surface or plane of the collimation grid to provide angled apertures 114, preferably as slots. These slots provide collimation at an angle to the surface 16 on which deposition is to be performed. That is, the angled vanes or slats of the collimation grid in accordance with the invention provides for limitation of the distribution of trajectories, in at least one coordinate direction, of particles ejected from the sputtering target about at least one central axis at an angle of less than 90° to the intended deposition surface. The uniform spacing of the collimation grid 110 from the target 12 and plasma 14 on one side and the deposition surface 16 on the other side, provides good regularity of deposition in regions across the entire area of the deposition surface or wafer.

Partitions may be provided in the slots 114 for control of aspect ratio of the collimator apertures in the direction of the long dimension of slats 118. Depending on the intended result, as will be discussed below, the spacing of the partitions in the slots 114 and the dimensions thereof can be determined to provide whatever directivity of sputtered particles is desired or required by increasing aspect ratio of the apertures. However, it is to be expected that increased aspect ratio achieved by decreasing the distance between partitions will also decrease deposition rate.

Therefore, forming partitions to follow the top and bottom of the collimator and a spacing between partitions approximately equal to the width of the slots will provide an aspect ratio of the apertures which establishes a similar degree of directivity in directions parallel and perpendicular to the long dimension of the slots. Also, in dependence on the relative degrees of directivity which may be desired, it is also possible to form the apertures in a honeycomb or other close-nested pattern or to omit partitions altogether. It is also to be understood that the slots may be made arcuate or angled in the plane of the collimator to selectively enhance difference of degree of directivity in orthogonal directions or to provide a plurality of directions in which portions of the populations of sputtered particles will be substantially collimated.

Angled collimation provided by the collimator 110 of FIG. 4 ideally will result in a deposition as shown in cross-section in FIG. 5. For clarity of initial discussion, surface 120 may be considered to be formed with recessed features having an aspect ratio of about 0.66 or, alternatively as formed with moderately separated upstanding features. The deposition angle is, in this example, 45°, indicated by arrows 125.

The resulting deposit of material is highly uniform in the direction of deposition, regardless of whether the portion of surface 120 is parallel or perpendicular to the wafer 120' or major dimension of the object presenting that surface. Non-uniformity in the lower corner of a recess does not occur and is not aggravated by the formation of an overburden as discussed above in regard to FIG. 3. It should also be noted that parts of the recessed portions of surface 120 are effectively obscured or protected from impingement of sputtered particles by other upstanding portions of the surface 120 as indicated by dashed line 127. The protected portions of the respective recesses will change only slightly due to deposition at location 121 and cause only slight change in the shape of the deposition at the toe 122 of the deposit which would be observable, as illustrated only if the incident particles were fully and completely collimated. Thus, the invention and methodology of the invention is seen to provide a potentially asymmetrical deposition on surfaces having severe topography.

FIGS. 5A–5C depict simulations of depositions for different angles of impingement of sputtered particles obtained by different angles of slots 114 formed in the collimator 110. These simulations also take into account a distribution of trajectories around the angle established by the collimator 110 which were omitted in the idealized depiction of FIG. 5. All of FIGS. 5A–5B assume surface topography including recessed features having a 1:1 aspect ratio.

Specifically, FIG. 5B corresponds to FIG. 5 but for the aspect ratio of the recesses and the distribution of trajectories about the angle of impingement which is idealized in FIG. 5. Line 127 of FIG. 5 would thus intersect the bottom corner of a recess. The deposit is seen to be very uniform and equal on the top and one sidewall with only slight thinning near the bottom of the sidewall deposit. The distribution of trajectories (from ideal collimation in which impingement was only from a specific angle) causes a small and relatively thin deposit on the bottom of the recess at the toe 124 of the deposit. The increase of thickness at 121 is evident but little effect is seen at 124. In any case, the effect would be to diminish the thickness in the toe region 124. The extent of the toe region 124, including the tapered portion of the sidewall deposit can be restricted by increasing the aspect ratio of the collimator but at the expense of reduction of deposition rate.

If the central angle of the impingement distribution is changed, for example, to 60°, as depicted in FIG. 5A, the top surface deposit and the sidewall deposit are both highly uniform but of differing thickness (the top surface deposit being favored) with the entire toe region on the bottom of the recess. This form of deposit would be preferred where uniformity of sidewall deposit was critical to the design since the toe region could be removed by anisotropic etching such as reactive ion etching (e.g. with a block out mask) and the top surface deposit could be removed by the same or a similar etching process or by planarization such as by a chemical/mechanical polishing process.

Conversely, if the central angle of the impingement distribution is changed to, for example, 30°, as shown in FIG. 5C, there would be essentially no deposition on the bottom of the recess. The thickness of the sidewall deposit is increased in comparison with FIG. 5B and the thickness of the top surface deposit is diminished. More importantly in regard to some possible applications of the invention which will be discussed below, such a change of angle and the aspect ratio of the recess allows masking of a portion of the sidewall without use of lithography. By the same token, the deposits formed on the trench bottom in FIGS. 5A and 5B can be used for sub-lithography masking as will be described in greater detail below in connection with the formation of a capacitor structure.

In summary, therefore, it is seen that the use of a collimator having angled slots provides for improved uniformity and/or control of sidewall deposits of sputtered material as well as asymmetrical deposition on topographical features of a surface. Improved fill at corners of recesses can be achieved and deposition on selected portions of the sidewalls of a recess can be done without lithographic processes which place limits on minimum feature size and include strict process tolerances.

The advantages of angled, collimated sputtering can also be used to form symmetrical deposits on topographical features of a surface. FIG. 6 schematically shows a variant form 160 of collimator 110 in place within a schematically depicted reactor. In this case, collimator 160 is formed with oppositely angled vanes or slats 161, 162 to provide symmetrical collimated particle trajectories. Depending on the topography of features on the deposition surface, however, different angles may be used. It is considered preferable that the collimator 160 and the sputtering target 12 be relatively increased in size in comparison with the deposition surface or wafer (or plural targets and/or collimators used) to provide uniformity of results over the entirety of the deposition surface. The particles emerging from each side of the collimator 160 will spread somewhat and therefore, it is tolerable for each side of the collimator to be somewhat smaller than the deposition surface. Otherwise, the reactor arrangement is similar to that described above with reference to FIG. 4.

The material deposits resulting from the use of collimator 160 are similar to those discussed above in regard to FIGS. 5A–5C but occur symmetrically on both sides of upstanding features and vane angles should be chosen accordingly. If differing angles of vanes 161, 162 are used, the deposits will be asymmetrical but, nevertheless, will approximate superposition of effects of different ones of FIGS. 5A–5C. The collimated beams of sputtered particles emanating from respective sides of the collimator do not significantly interfere with each other and the result, depending on the angle and aspect ratio of the recessed features will be replicated symmetrically and superimposed. By the same token, different vane angles on respective sides of collimator 160 will provide different shapes of depositions on respective trench sidewalls.

It should be noted that deposition on the top surface between recessed features will have components attributable to both sides of collimator 160. Therefore, vane angles producing particle trajectories at more acute angles to the deposition surface are, in most cases, appropriate to a collimator having oppositely angled vanes. For the same reason, the shape of the deposit is highly dependent on surface topography. As shown in FIG. 6A, when a vane angle of about 60° is used in connection with recesses of reduced aspect ratio (or upstanding features of increased separation), a very uniform deposition over all surfaces is achieved with no reduction of deposit thickness in the bottom corners of the recesses. Since the formation of toe regions is complementary, the deposition on the bottom of the recesses is substantially uniform although slightly reduced from the thickness of deposition on the top surface between recesses.

If the collimator 160 is used with high aspect ratio features or very small recesses, caps 163 can be formed on the upstanding features with no significant deposition within the lower portions of the recesses, particularly if more acute particle trajectories are derived from vanes at similarly acute angles to the deposition surface. The deposition can also be used in conjunction with such acute angles to close the tops of recesses, if desired. Further, if deposition is followed by planarization, such as by chemical-mechanical polishing, a T-shaped structure such as that depicted in FIG. 6C can be formed which may have utility in some micromachines and circuit elements operating on vacuum-tube principles.

FIG. 7 schematically illustrates another variant form of the invention. In this case, the collimator vanes are arranged to provide a very shallow angle of particle impingement on surface 16. When angles of less than about 15° to surface 16 are used, material is deposited in long, fiber-like forms 72 having a relatively porous texture. The fibers are angled approximately parallel to the direction of particle trajectory. While not wishing to be held to any particular theory for this effect, it is believed that this process can be visualized by considering each deposited particle 71 as a small upstanding feature. Recalling that deposition rates increase at angles approaching 90°, each such deposited particle 71 will present a preferred surface (e.g. a sidewall) for the deposit of other particles while shielding other regions 73 of the deposition surface from contact by other sputtered particles. For this reason, straighter columns with increased space between them would be expected from a collimator having oppositely angled vanes such as that depicted in FIG. 6, assuming, of course, more acutely angled vanes 161, 162 than those illustrated.

The resulting surface texture has vastly increased effective surface area. Therefore, this process of surface treatment in accordance with the invention has utility for any purpose which is affected by effective surface area such as capacitors, catalysts, particle detectors, fluid filters, solar cells and many other types of devices.

As an alternative to the collimator of FIG. 6 when it is desired to fill trenches, apertures or other recessed features of particularly high aspect ratio, it is also possible to rotate or otherwise cause relative motion between the collimator and the deposition surface. A collimator 180 formed in a round configuration as shown in FIG. 8 is considered to be preferable in this case, allowing rotation of the collimator around an axis approximately perpendicular to the deposition surface in the direction indicated by arrows 181. The mechanism by which the collimator is rotated or supported in the reactor is not important to the practice of the invention. Collimator vane angle is preferably in the range of 45° to 60°. Thus the deposition will be of a profile similar to that of FIG. 5B or 5A but rotationally symmetrical.

Figure 9:
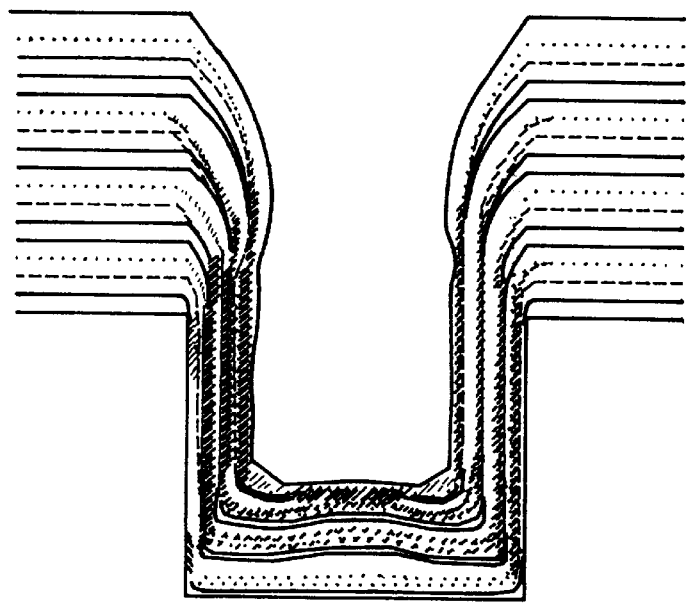
FIG. 9 is a simulated cross-sectional view of a deposit formed using the collimator and methodology of FIG. 8.

A simulation of the deposition profile achieved with a rotating collimator having vanes or slats angled at 45° is shown in FIG. 9. As can be seen, the overburden is limited and the deposition on the bottoms and sidewalls of the recessed feature is very similar. It is to be expected that the vane angle can be used to relatively adjust the relative rates of deposition on the bottom and sidewalls of the recessed feature. Further, it is expected that the small overburden could be further reduced by inclusion of partitions in the slots of the collimator to increase the aspect ratio of the slots in a direction parallel to the vanes or slats 182. It should be noted also that the deposition on the surface surrounding the recessed feature proceeds more rapidly than within the recessed feature. This technique can therefore be used to increase the aspect ratio of the recessed feature.

Figure 10:
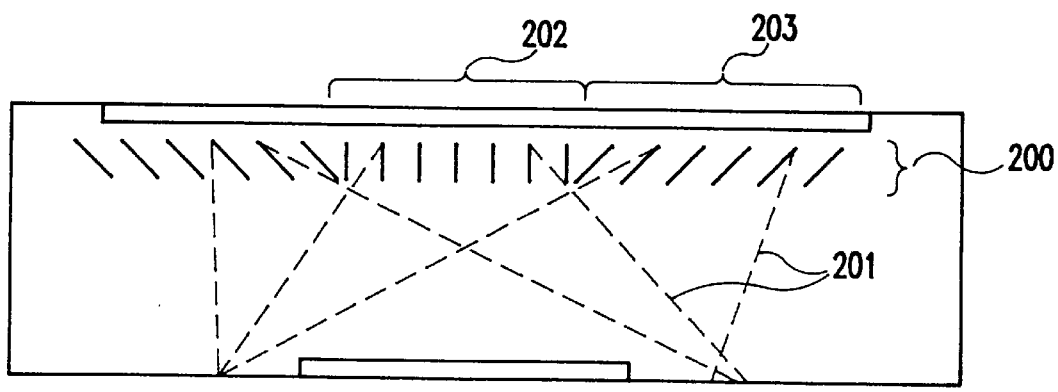
FIG. 10 is a further variant form of a collimator in accordance with the invention.

An alternative form 200 of collimator 110, 160 or 180 is shown in place within a reactor schematically illustrated in FIG. 10. This collimator can be rotated or not and it is expected that the results would be similar in either case. Rotation of the collimator would be somewhat preferable if features, whether upstanding or recessed, were of similar dimensions in orthogonal directions parallel to the deposition surface and a stationary collimator (and without partitions) would probably be preferred if the features were elongated.

This collimator 200 has oppositely angled vanes, as in collimator 160, with a central portion 202 providing collimation at an angle of 90° to the deposition surface. This collimator can also be considered as adding oppositely angled vanes to the collimator of FIG. 1. The collimator and target should be sized in a manner similar to that discussed above in regard to collimator 160, taking into account the acceptance angle of the collimator, the collimator aspect ratio, the deposition surface size, etc. Exemplary acceptance angles and corresponding distribution of particle trajectories is shown by dashed lines 201.

The effect on deposition of collimator 200 is basically a superposition of the effects of the collimator 160 (e.g. symmetrical reflections of FIGS. 5A–5C) on the deposition profile illustrated in FIG. 3. Thus, if a fairly steep collimation angle is chosen, the tapered deposition on the bottom of a recessed feature (e.g. FIG. 5B) complements the undesirable portions (e.g. 38) of the deposition profile of FIG. 3 and improved trench filling and deposition uniformity can be achieved. Additionally as can be appreciated from dashed lines 201, indicating the acceptance angle of the collimator, the depositions from each section of the collimator are complementary and very uniform deposition results over the entire area of the wafer, including the edges.

As a further variation of collimator 200, the central portion 202 could be formed with oppositely angled vanes, as well, but angled to provide a steeper angle (e.g. 70°–80°) of particle trajectory than the outer portions 203 of the collimator. The resulting deposition profile would then be a superposition of profiles similar to those of FIGS. 5A–5C, as discussed above, and may be particularly useful in adjustment of deposit profiles near the wafer edge.

To summarize the foregoing, sputtering with angled collimation provides a technique of providing selectivity between the bottom and sidewalls (or portions thereof) of recessed features and to favor the latter, if desired. Thee provision of different angles of collimation in the same deposition process provides the effect of superposition of deposition at each of the angles individually and collimation may be freely provided at any of a plurality of angles. Aspect ratio of apertures in the angled collimator can be adjusted with partitions to control the angular distribution of particle trajectories in orthogonal directions. Rotation of the collimator also increases uniformity of filling of recessed features such as round or square apertures.

Figure 11:
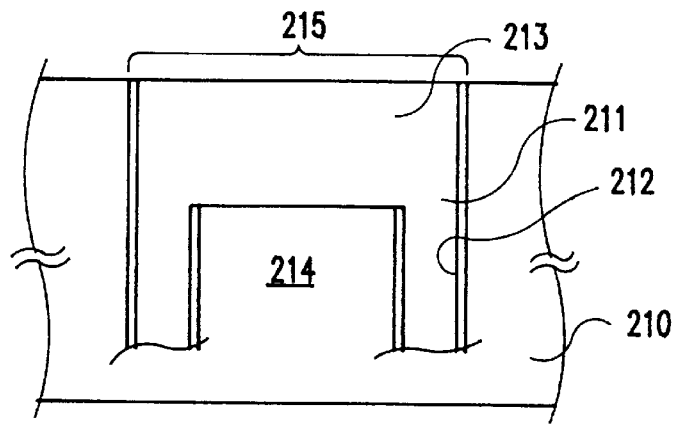
FIGS. 11, 12, 13, 14, 15, 16, 17 and 18 are a sequence of cross-sectional views showing formation of a trench capacitor including a strap structure for a contact formed in accordance with the invention and without a lithography step and, therefore, potentially at sub-lithography size.

Referring now to FIGS. 11–18, effects of the invention in an exemplary set of process steps for forming a capacitor and a strap connection thereto at sub-lithographic dimensions are shown in cross-section. An initial stage of fabrication of a capacitor structure is shown in FIG. 11. An exemplary substrate 210 of monocrystalline silicon is assumed, as is a deep trench 215 containing oxide sidewall spacers 211 and separated by a polycrystalline silicon node 214. The aperture above the trenches is assumed to have been filled with a material such as silicon oxide which could be deposited when the trenches are filled. The structure is also assumed to have been planarized after trench filling to the surface of substrate 210.

It should be noted that trench 215 can be formed at minimum lithographic feature size, making node 214 sub-lithographic in size. For an understanding of the benefits of the invention, it is only necessary to note that spacers 211 have transverse dimensions which can be substantially less than can be achieved by lithographic processes.

Figure 12:
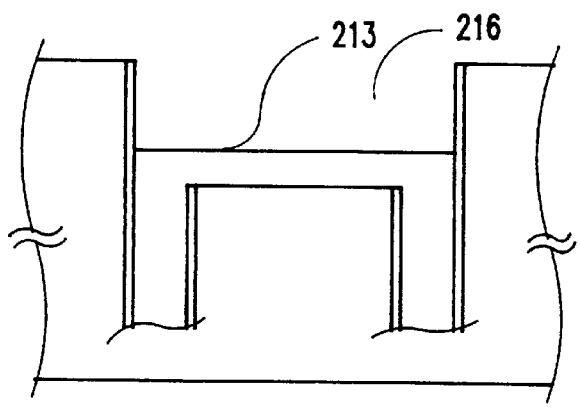
Figure 13:
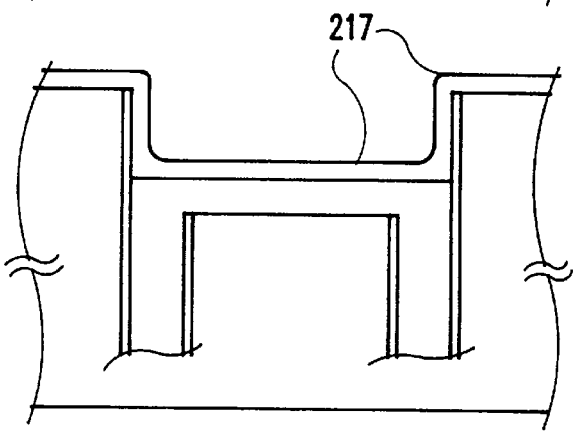
Figure 14:
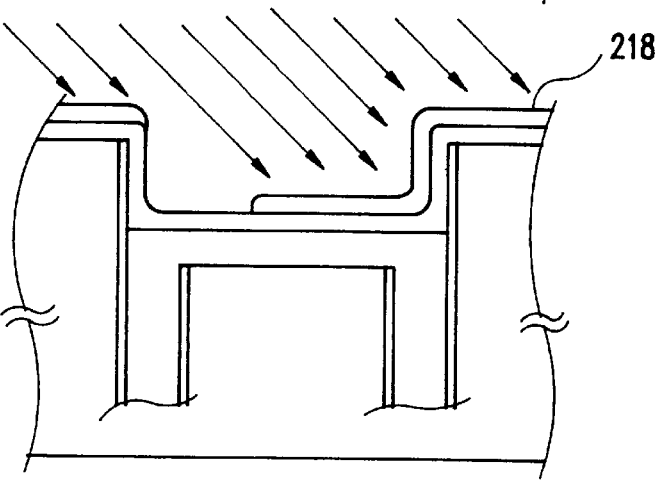

Referring now to FIG. 12, a selective etch back of the fill material 213 is performed by, for example, reactive ion etching which is selective between the subtrate and the silicon oxide. This forms a recessed feature 216 above a remaining layer of fill material 213. Following the etch back process, a blanket layer 217 of silicon oxide is deposited by, for example, chemical vapor deposition, as shown in FIG. 13.

Then, in accordance with a simple application of the invention as described above in connection with FIGS. 4 and 5, a material such as a metal is selectively deposited in a portion of the recessed feature by angled collimated sputtering to form a mask 218 having resolution and registration accuracy below the dimensions available from lithographic processes. The formation of this mask is essentially a self-aligned process and no procedures are required for exact registration of the mask; the location of the edge of the mask in the bottom of the recessed feature being entirely a function of the depth of the recessed feature (which varies slightly during deposition as the deposit thickness increases, as noted above) and the angle at which collimated sputtering is carried out.

Figure 15:
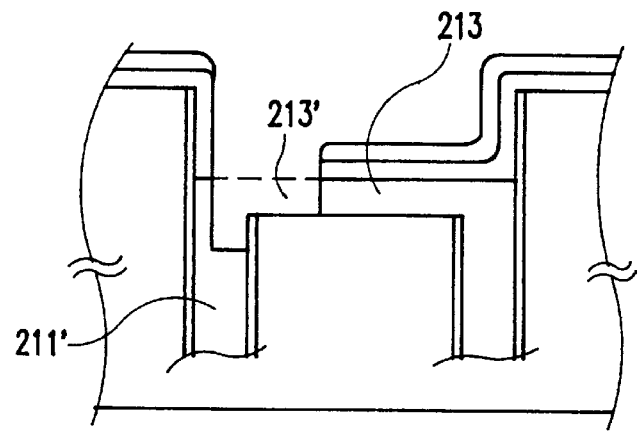
Figure 16:
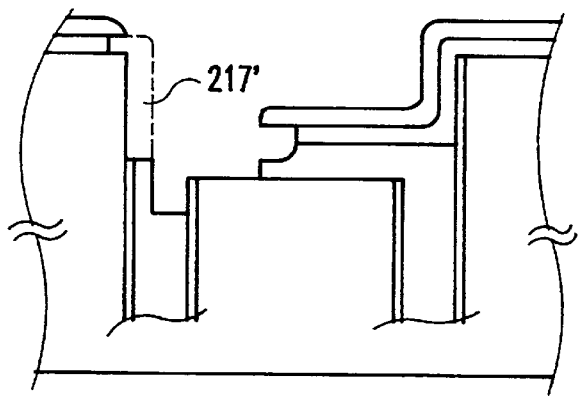
Figure 17:
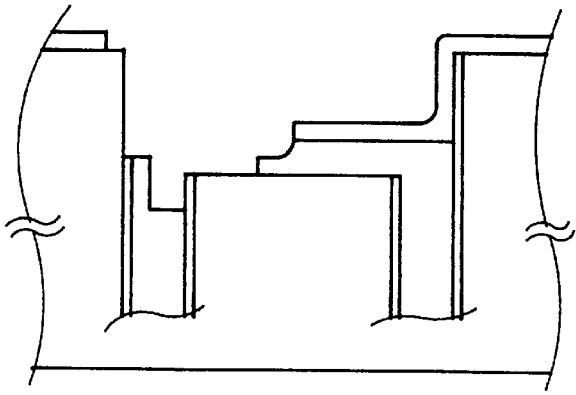
Figure 18:
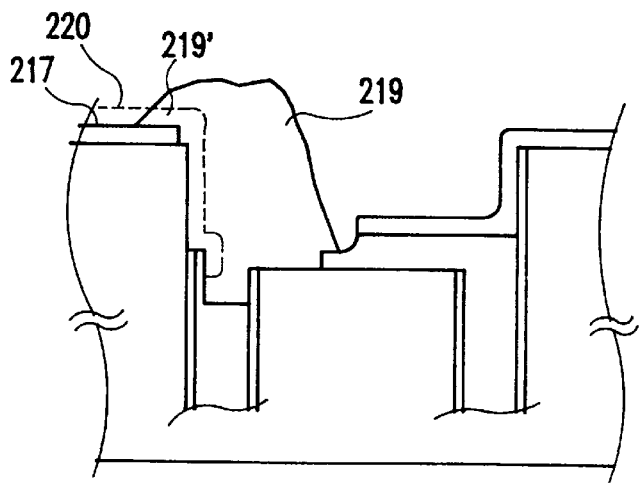

In accordance with the mask 218 of metal or other material, an anisotropic etch is performed by, for example, reactive ion etching (RIE) to open the oxide 217 (FIGS. 13 and 14) and form a relatively large contact area of the polysilicon 211' by removing the remaining fill 213' associated with the left side trench, as shown in FIG. 15. This anisotropic etch is then followed by an isotropic etch with buffered hydrofluoric acid (BHF), for example, to remove sidewall oxide 217', as shown in FIG. 16. Some undercutting of the metal mask will occur during this process, as shown, but is of little consequence in the process. Then, as shown in FIG. 17, the metal mask 218 can be stripped and a strap contact 219 formed over severe topography by selective chemical vapor deposition of silicon 219 depositing on exposed silicon but not on exposed oxide. Alternatively, a metal strap contact 219' could be formed over such severe topography by the angled collimated sputtering of metal in much the same manner as discussed in regard to FIG. 14 but from the right side rather than from the left.

It should be noted, between the two alternatives noted above, selective deposition of silicon is a high temperature process and should not be done in the presence of metal, thus requiring removal of the metal mask and other surface metallization. Surface conductors are then formed by a subsequent metal deposition step by known techniques. However, if the latter alternative of angled deposition is used to form the strap connection, a blanket layer 220 of metal will be formed on the upper surface of the substrate or layer 210 and over layer 217, as well. This metallization can then be patterned with a mask to form surface connections to the capacitor.

It should be understood that the process shown in FIGS. 11–18 could be repeated to form similar connections to the trench on the right side of the recess in order to formstraps on both sides of the trench, if desired. Thus, it is seen that the invention provides several techniques by which several significant problems in the formation of integrated circuits including the formation of masks to produce features of sub-lithographic dimensions and the formation of connectors and insulators over severe topography. It should also be recognized that even though the invention has applications at sub-lithographic dimensions, the masking process described above is also self-aligned and may be used at any size to form masks without the use of lithography. Thus, the invention allows for simplification of many masking processes since no steps need be taken to assure precise registration of a mask, which is inherent in lithographic processes but may be formed in a self-aligned manner and as well as of sub-lithographic dimensions.

Figure 19:
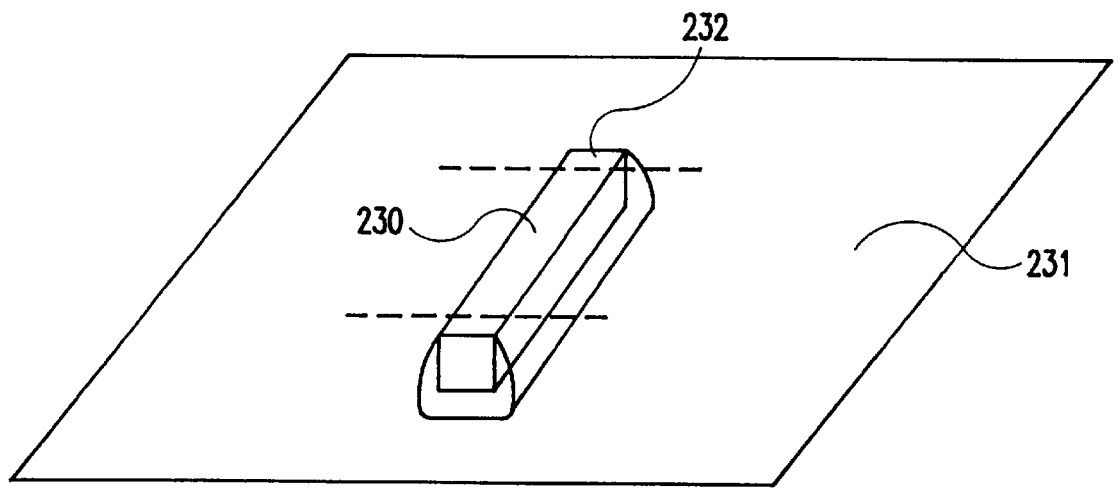
FIG. 19 illustrates formation of sub-lithography features with a conventional sidewall image transfer technique.
Figure 20:
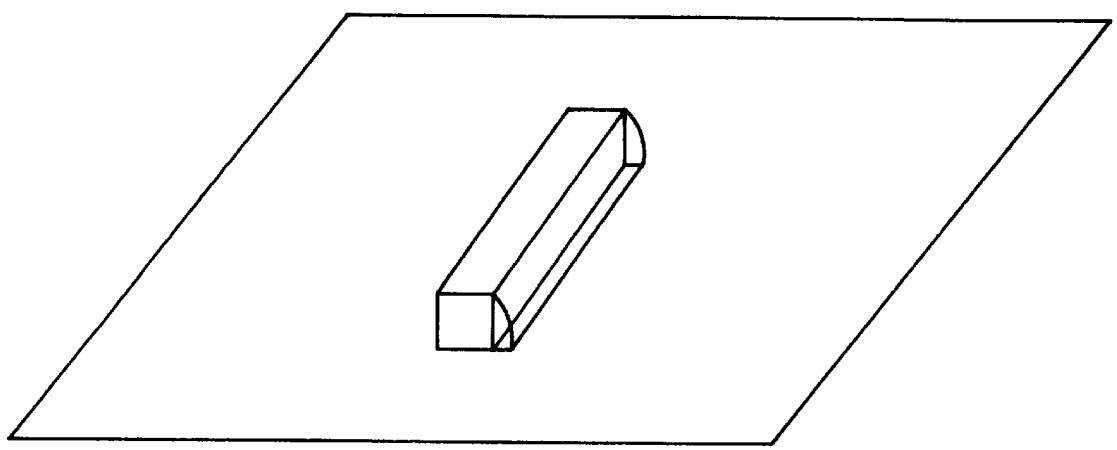
FIG. 20 illustrates sidewall image transfer utilizing the apparatus and methodology of the present invention.

In the interest of completeness, reference is now made to FIGS. 19 and 20 to provide a full understanding of the advantages of the invention in regard to sidewall image transfer techniques which may also be used to form features of sub-lithographic dimensions. Consider, for example, an upstanding feature 230, generally referred to as a mandrel, on a surface 231. By known techniques of deposition in combination with chemical/mechanical polishing techniques sidewall features may be formed on the sides of a mandrel, as shown in FIG. 19. However, even though ends of the mandrel and the associated sidewall depositions can be removed by block-out lithography techniques, the closed geometry of the perimeter of the mandrel, if formed of a minimum dimension near the limit of lithographic feature size, requires that any features formed by sidewall image transfer be formed in pairs. While many useful structures include pairs of features, there has been no technique for forming a single feature by sidewall image transfer, such as a very fine conductor.

The present invention, however, by allowing highly preferential deposition on a single sidewall of a mandrel from angled collimated sputtering, does allow formation of a singular feature at sub-lithographic dimensions on only one or a selected plurality of sidewalls of the mandrel, as shown in FIG. 20. For example, highly collimated angled sputtering can preferentially form a much greater thickness of material on one side of the mandrel than may be incidentally deposited elsewhere. Any other such incidental deposition can be readily removed by isotropic etching due to the difference in thickness of the deposits. The same process can also form deposits on two sides of the mandrel by performing the angled collimated sputtering at an angle to the "footprint" of the mandrel so that two sides of the mandrel are exposed to the incident particles. Closely spaced mandrels, possibly of differing heights, also allow shadowing effects to be exploited for terminating patterns parallel to the wafer surface, potentially in conjunction with the formation of structures such as those shown in FIG. 6C.

As alluded to above, angled slats in the collimator (e.g. chevron-shaped slats) could preferentially form deposits on three sides of the mandrel. Such an effect could also be achieved by oscillatory rotation of a rotatable collimator. The relative thicknesses of the sidewall deposits can also be adjusted by the angle of the exposed mandrel surfaces, relative areas of the collimator having differing collimation directions, relative degrees of collimation (e.g. by adjustment of aspect ratio in different collimation directions), by variation of oscillatory or rotational motion of a rotatable collimator or any combination of these techniques. As pointed out above, the effects of the invention when combinations of angles or other techniques are employed substantially superposes the effects of the techniques as practiced individually. Therefore design of a suitable collimation arrangement to achieve any form of preferential deposition would be readily apparent to those skilled in the art in light of this description of the invention.

In view of the foregoing, it is seen that the invention provides a technique by which material deposition of much improved uniformity can be achieved, even when deposition is made on surfaces including severe topography. By the same token, deposition on any surface, including sidewall surfaces, can be selectively made preferential; providing much increased flexibility of design and manufacturing processes and to form asymmetrical deposits and singular SIT features and other geometries not previously possible. A self-aligned and simplified alternative to lithographic processes is also provided by the invention and these processes can be extended to sub-lithographic dimensions.

While the invention has been described in terms of a single preferred embodiment, those skilled in the art will recognize that the invention can be practiced with modification within the spirit and scope of the appended claims. For example, the invention is not limited to use with extremely small structurea and severe topographies but could be used for depositing material at only the cutting edges of saws or drills or on turbine blades and other devices, particularly those having repeating shapes formed thereon.

Having thus described my invention, what I claim as new and desire to secure by Letters Patent is as follows:

1. A method of depositing material on a surface including the steps of orienting said surface and a sputtering target generally parallel to each other, removing particles of material from said sputtering target in the presence of a plasma, limiting a distribution of trajectories of a portion of said particles in at least one coordinate direction around each of two central axes, one central axis of said two central axes being oriented at an angle of less than 90° to said surface, and depositing at least some of said particles on said surface.

2. A method as recited in claim 1, wherein said distribution of particles around one central axis is limited in two orthogonal coordinate directions by said limiting step.

3. A method as recited in claim 1, wherein one said central axis is oriented at approximately 60° to said surface.

4. A method as recited in claim 1, wherein one said central axis is oriented at less than approximately 15° to said surface.

5. A method as recited in claim 1, wherein said surface includes a plurality of upstanding or recessed features, said method including the further steps of masking a portion of one feature with one of:
        another portion of said at least one feature, and
        a portion of another of said plurality of features, and depositing some of said particles on a portion of a feature exposed by said masking step.

6. A method as recited in claim 5, wherein said feature is an upstanding mandrel feature, said method including the further step of removing said upstanding mandrel feature while maintaining some of said particles deposited on said portion of at least one feature.

7. A method as recited in claim 5, including the further step of removing some of said particles deposited on said portion of at least one feature.

8. A method as recited in claim 7, wherein said removing step includes the step of removing some particles deposited on a top of said at least one feature.

9. A method as recited in claim 1, including the further step of altering orientation of one said central axis of one said distribution of trajectories.

10. A method as recited in claim 9, wherein said step of altering orientation of said central axis is performed by rotating said one central axis around an axis substantially perpendicular to said surface.

11. A method as recited in claim 1, including the further step of limiting a distribution of trajectories of another portion of said particles in at least one coordinate direction around a central axis oriented at an angle of less than 90° to said surface, and depositing at least some of said another portion of said particles on said surface.

12. A method as recited in claim 1, wherein said two central axes are symmetrically disposed at equal angles to said surface.

13. A method as recited in claim 5, wherein one said central axis is oriented at less than approximately 15° to said surface.

14. A method as recited in claim 12, wherein said two central axes are oriented at less than approximately 15° to said surface.

15. A method of depositing material on a surface including the steps of orienting said surface and a sputtering target generally parallel to each other, removing particles of material from said sputtering target in the presence of a plasma, limiting a distribution of trajectories of a portion of said particles in at least one coordinate direction around a central axis oriented at an angle of less than 15° to said surface, and depositing at least some of said particles on said surface and on particles deposited on said surface.

16. A method as recited in claim 15, wherein said surface includes a plurality of upstanding or recessed features, said method including the further steps of masking a portion of one feature with one of:
        another portion of said at least one feature, and
        a portion of another of said plurality of features, and depositing some of said particles on a portion of a feature exposed by said masking step.

\* \* \* \* \*